(12) United States Patent
Kim

(10) Patent No.: US 6,617,229 B2
(45) Date of Patent: Sep. 9, 2003

(54) METHOD FOR MANUFACTURING TRANSISTOR OF DOUBLE SPACER STRUCTURE

(75) Inventor: Ha Zoong Kim, Kyoungki-do (KR)

(73) Assignee: HYnix Smeiconductor Inc., Kyoungki-do (KR)

( * ) Notice: Subject to any disclaimer, the term of this patent is extended or adjusted under 35 U.S.C. 154(b) by 0 days.

(21) Appl. No.: 10/103,692

(22) Filed: Mar. 25, 2002

(65) Prior Publication Data

US 2002/0142556 A1 Oct. 3, 2002

(30) Foreign Application Priority Data

Mar. 28, 2001 (KR) .......................... 2001-16310

(51) Int. Cl.$^7$ ...................... H01L 2/3205; H01L 2/4763
(52) U.S. Cl. .................. 438/585; 438/592; 438/595
(58) Field of Search ..................... 438/585, 595, 438/302, 592, 305, 286, 163, 582

(56) References Cited

U.S. PATENT DOCUMENTS 5,824,588 A * 10/1998 Liu ........................... 438/302
5,925,914 A * 7/1999 Jiang et al. ................. 438/286
5,929,483 A * 7/1999 Kim et al. ................... 257/336
6,020,242 A * 2/2000 Tsai et al. ................... 438/279
6,207,519 B1 * 3/2001 Kim et al. ................... 438/303
6,329,279 B1 * 12/2001 Lee ............................. 438/619
6,350,665 B1 * 2/2002 Jin et al. ..................... 438/585

* cited by examiner

Primary Examiner—John F. Niebling
Assistant Examiner—Walter L. Lindsay, Jr.
(74) Attorney, Agent, or Firm—Pillsbury Winthrop LLP

(57) ABSTRACT

A method for manufacturing a transistor of a double spacer structure is disclosed, in which a local LDD region is formed by forming a transistor including a gate electrode, and an oxide film spacer and a nitride film spacer formed sequentially, dry etching the oxide film spacer using the nitride film spacer as a mask, and injecting an impurity ion into an LDD region of a portion where the oxide film spacer is etched, short channel effect is prevented and current characteristic of the transistor is improved by combination of the ion injection process considering trade-off relation between the short channel effect and the current characteristic of the transistor during design of a device.

12 Claims, 4 Drawing Sheets

METHOD FOR MANUFACTURING TRANSISTOR OF DOUBLE SPACER STRUCTURE

BACKGROUND OF THE INVENTION

This application relies for priority upon Korean Patent Application No. 2001-16310 filed on Mar. 28, 2001, the contents of which are herein incorporated by reference in their entirety.

1. Field of the Invention

The present invention relates to a method for manufacturing a transistor of a double spacer structure, and more particularly, to a method for manufacturing a transistor of a double spacer structure in which an impurity ion is injected into a local portion of a lightly doped drain (LDD) region to form a local LDD region so as to prevent short channel effect and improve current characteristic of the transistor.

2. Background of the Related Art

A conventional art method for manufacturing a transistor of a double spacer structure will be described with reference to FIGS. 1A to 1C.

As shown in FIG. 1A, a first oxide film, a polysilicon layer 15a, a metal layer 15b, a first nitride film 17 as a hard mask layer, and a photoresist film are sequentially formed on a semiconductor substrate 11.

The photoresist film is selectively exposed and developed to remain in a region where a gate electrode will be formed.

Then, the first nitride film 17, the metal layer 15b, the polysilicon layer 15a, and the first oxide film are etched using the selectively exposed and developed photoresist film as a mask. The photoresist film is then removed, thereby forming a gate oxide film 13 and a gate electrode 15 having a stack structure of the polysilicon layer 15a and the metal layer 15b.

As shown in FIG. 1B, a second nitride film 19 that serves as a gate passivation film is formed on an entire surface including the gate electrode 15.

An LDD region 21 is formed by an ion injection process and a drive-in process using the gate electrode 15 as a mask.

Subsequently, a pocket impurity ion region 23 is formed by a tilt ion injection process and a drive-in process using the gate electrode 15 as a mask.

As shown in FIG. 1C, a second oxide film and a third nitride film are sequentially formed on the entire surface. The third nitride film and the second oxide film are then etched back, so that a second oxide film spacer 25 and a third nitride film spacer 27 are formed at both sides of the gate electrode 15.

Source and drain regions 29 are formed by an ion injection process and a drive-in process into the entire surface using the gate electrode 15, the second oxide film spacer 25, and the third nitride film spacer 27 as masks.

The conventional method for manufacturing a transistor of a double spacer structure has several problems.

During the ion injection processes of the source and drain regions and the LDD region, if energy and dose for ion injection increase in order to improve current characteristic of the transistor, short channel effect increases.

Furthermore, if the ion injection process of the pocket impurity ion region is performed to prevent the short channel effect, the current characteristic of the transistor, such as punch through, is deteriorated.

SUMMARY OF THE INVENTION

Accordingly, the present invention is directed to a method for manufacturing a transistor of a double spacer structure that substantially overcomes one or more problems due to limitations and disadvantages of the prior art.

An object of the present invention is to provide to a method for manufacturing a transistor of a double spacer structure in which a local LDD region is formed by forming a transistor including a gate electrode, an oxide film spacer and a nitride film spacer sequentially formed, dry etching the oxide film spacer using the nitride film spacer as a mask, and injecting an impurity ion into an LDD region of a portion where the oxide film spacer is etched, thereby preventing short channel effect from occurring and improving current characteristic of the transistor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a transistor of a double spacer structure according to the present invention includes the steps of: forming a gate electrode on a semiconductor substrate; forming a gate passivation film on an entire surface; forming an LDD region and a pocket impurity ion region in a surface of the semiconductor substrate at both sides of the gate electrode; sequentially forming a first insulating film and a second insulating film on the gate passivation film, the first insulating film having different etching selectivity from that of the gate passivation film and the second insulating film; anisotropically etching the first insulating film and the second insulating film to form a double spacer structure of a first insulating film spacer and a second insulating film spacer; forming source and drain regions in a surface of the semiconductor substrate at both sides of the gate electrode including the double spacer structure; dry etching the first insulating film spacer to expose the gate passivation film between the gate electrode and the second insulating film spacer; and forming a local LDD region in the LDD region between the gate electrode and the second insulating film spacer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

A method for manufacturing a transistor of a double spacer structure according to the preferred embodiment of the present invention will be described with reference to FIGS. 2A to 2D.

Figure 1A:
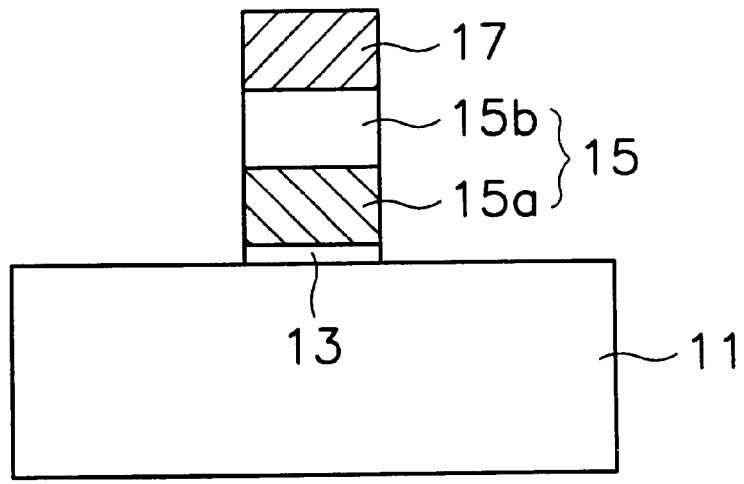
FIGS. 1A to 1C are sectional views illustrating process steps of a conventional method for manufacturing a transistor of a double spacer structure.
Figure 1B:
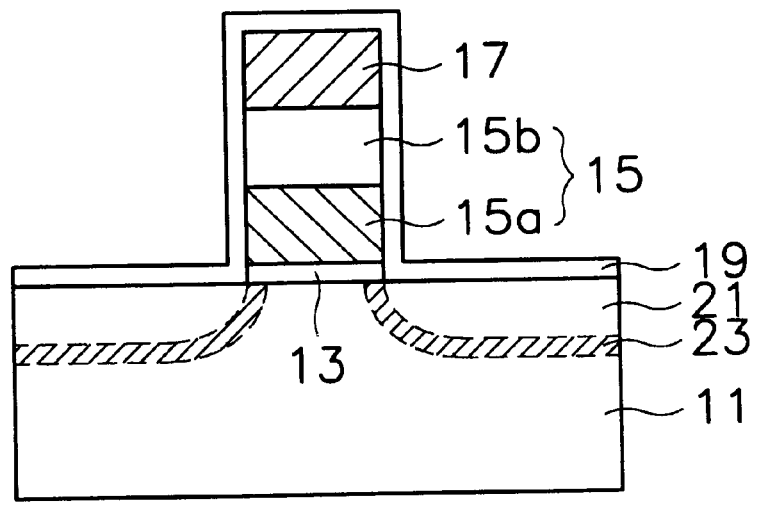
Figure 1C:
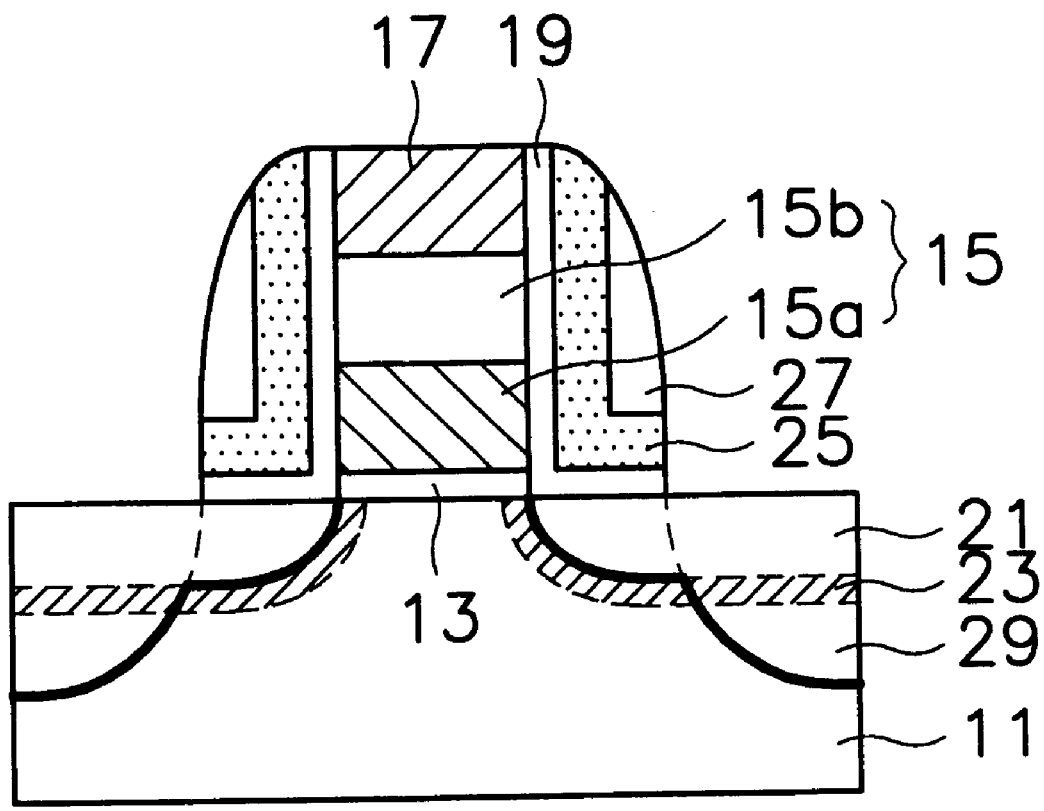
Figure 2A:
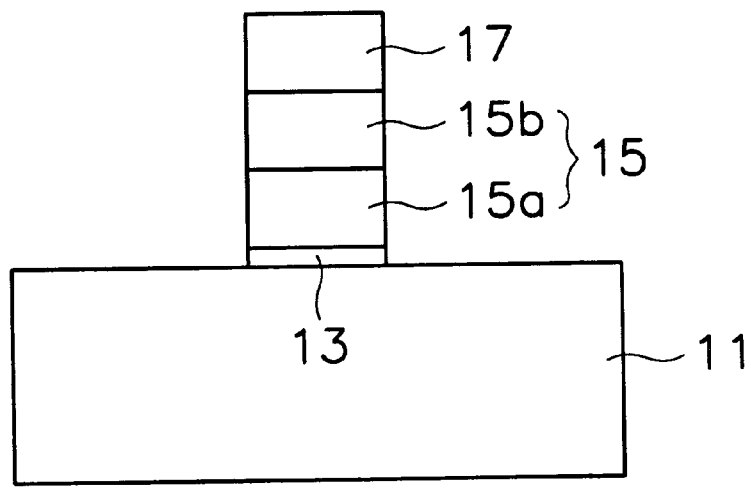
FIGS. 2A to 2D are sectional views illustrating process steps of a method for manufacturing a transistor of a double spacer structure in accordance with the preferred embodiment of the present invention.

As shown in FIG. 2A, a first oxide film, a polysilicon layer 15a, a metal layer 15b, a first nitride film 17, and a photoresist film are sequentially formed on an n-type semiconductor substrate 11.

The photoresist film is selectively exposed and developed to remain in a portion where a gate electrode will be formed.

Then, the first nitride film 17, the metal layer 15b, the polysilicon layer 15a, and the first oxide film are etched using the selectively exposed and developed photoresist film as a mask. The photoresist film is then removed, thereby forming a gate oxide film 13 and a gate electrode 15 having a stack structure of the polysilicon layer 15a and the metal layer 15b.

Figure 2B:
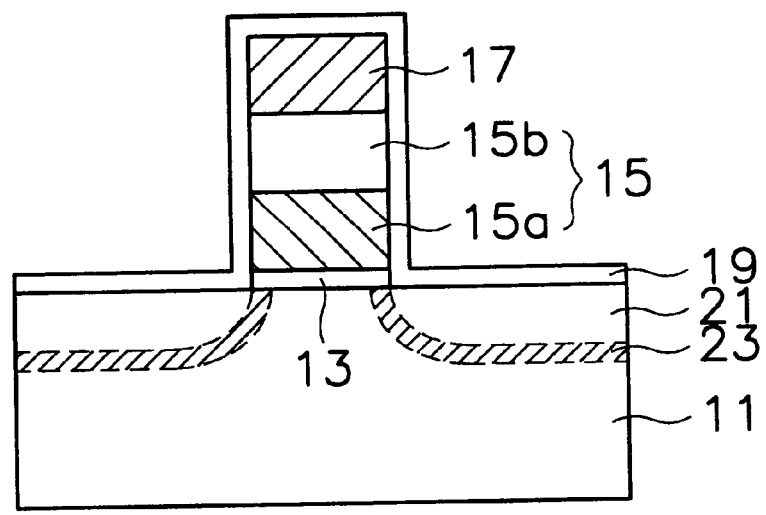

As shown in FIG. 2B, a second nitride film 19 that serves as a gate passivation film is formed on an entire surface including the gate electrode 15.

An LDD region 21 is formed in a surface of the semiconductor substrate 11 at both sides of the gate electrode 15 by a p-type impurity ion injection process and a drive-in process using the gate electrode 15 as a mask.

Subsequently, a pocket impurity ion region 23 is formed to surround the LDD region 21 by a tilt ion injection process of an n-type impurity ion and a drive-in process using the gate electrode 15 as a mask.

Figure 2C:
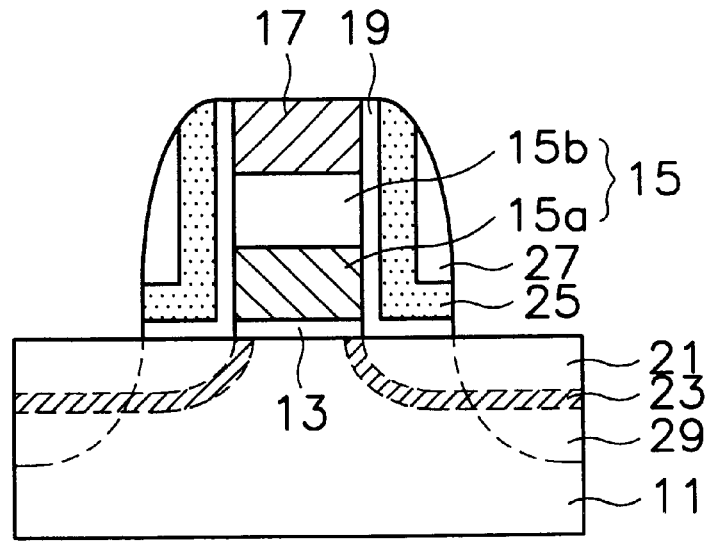

As shown in FIG. 2C, a second oxide film and a third nitride film are sequentially formed on the entire surface. The third oxide film and the second nitride film are then etched back, so that a double spacer structure of a second oxide film spacer 25 and a third nitride film spacer 27 is respectively formed at both sides of the gate electrode 15.

Subsequently, source and drain regions 29 are formed in the surface of the semiconductor substrate 11 at both sides of the gate electrode 15 including the second oxide film spacer 25 and the third nitride film spacer 27 by an ion injection process of a p-type heavily doped impurity ion and a drive-in process using the gate electrode 15, the second oxide film spacer 25, and the third nitride film spacer 27 as masks.

Figure 2D:
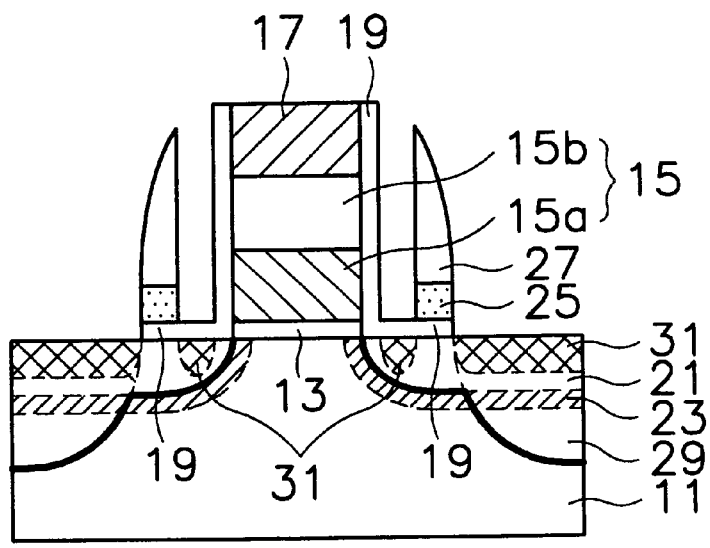

As shown in FIG. 2D, the second oxide film spacer 25 is dry etched using the first nitride film 17, the second nitride film 19, and the third nitride film spacer 27 as masks.

Then, a local LDD region 31 is formed in the surface of the semiconductor substrate 11 by an impurity ion injection process and a drive-in process using the first nitride film 17, the second nitride film 19, and the third nitride film spacer 27 as masks.

The ion injection process of the local LDD region is performed considering trade-off relation between short channel effect and current characteristic of the transistor during design of a device. Accordingly, the short channel effect is prevented and the current characteristic of the transistor can be improved.

In other words, during the ion injection process of the local LDD region 31 in the same manner as the pocket impurity ion region 23, an n-type impurity ion which is the opposite conductive type to that of the source and drain regions 29 is injected, thereby preventing the short channel effect.

Furthermore, since the LDD region 21 is formed by the ion injection process of the p-type impurity ion which is the same conductive type as the source and drain regions 29, resistance of the LDD region 21 is reduced. Therefore, the current characteristic of the transistor is improved and at the same time short channel effect and punch through effect are prevented by the pocket impurity ion region 23.

As aforementioned, the method for manufacturing a transistor of a double spacer structure has the following advantages.

In the present invention, since the local LDD region is formed by forming the transistor including the gate electrode, and the oxide film spacer and the nitride film spacer formed sequentially, dry etching the oxide film spacer using the nitride film spacer as a mask, and injecting an impurity ion into the LDD region of a portion where the oxide film spacer is etched, short channel effect is prevented and the current characteristic of the transistor is improved by combination of the ion injection process considering trade-off relation between the short channel effect and the current characteristic of the transistor during design of the device.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for manufacturing a transistor of a double spacer structure, the method comprising:

forming a transistor including a gate electrode formed on a semiconductor substrate and a double spacer structure of a first insulating film spacer and a second insulating film spacer;

removing the first insulating film spacer formed between the gate electrode and the second insulating film spacer; and forming a local LDD region in a surface of the semiconductor substrate between the gate electrode and the second insulating film spacer.

2. The method of claim 1, wherein the first insulating film is formed of an oxide film and the second insulating film is formed of a nitride film.

3. A method for manufacturing a transistor of a double spacer structure, the method comprising:

forming a gate electrode on a semiconductor substrate;

forming a gate passivation film on an entire surface;

forming an LDD region and a pocket impurity ion region in a surface of the semiconductor substrate at both sides of the gate electrode;

forming a double spacer structure of a first insulating film spacer and a second insulating film spacer on the semiconductor substrate at both sides of the gate electrode;

forming source and drain regions in the surface of the semiconductor substrate at both sides of the gate electrode including the double spacer structure;

dry etching the first insulating film spacer to expose the gate passivation film between the gate electrode and the second insulating film spacer; and forming a local LDD region in the LDD region between the gate electrode and the second insulating film spacer.

4. The method of claim 3, wherein the pocket impurity ion region is formed by a tilt ion injection process.

5. The method of claim 3, wherein the gate passivation film and the second insulating film are formed of a nitride film and the first insulating film is formed of an oxide film.

6. The method of claim 3, wherein the local LDD region is formed by injecting an impurity ion having a conductive type opposite to that of the source and drain regions.

7. The method of claim 3, wherein the local LDD region is formed by injecting an impurity ion having a conductive type same as that of the source and drain regions.

8. A method for manufacturing a transistor of a double spacer structure, the method comprising:

forming a gate electrode on a semiconductor substrate;

forming a gate passivation film on an entire surface;

forming an LDD region and a pocket impurity ion region in a surface of the semiconductor substrate at both sides of the gate electrode;

sequentially forming a first insulating film and a second insulating film on the gate passivation film, the first insulating film having different etching selectivity from that of the gate passivation film and the second insulating film;

anisotropically etching the first insulating film and the second insulating film to form a double spacer structure of a first insulating film spacer and a second insulating film spacer;

forming source and drain regions in the surface of the semiconductor substrate at both sides of the gate electrode including the double spacer structure;

dry etching the first insulating film spacer to expose the gate passivation film between the gate electrode and the second insulating film spacer; and forming a local LDD region in the LDD region between the gate electrode and the second insulating film spacer.

9. The method of claim 8, wherein the pocket impurity ion region is formed by a tilt ion injection process.

10. The method of claim 8, wherein the gate passivation film and the second insulating film are formed of a nitrate film and the first insulating film is formed of an oxide film.

11. The method of claim 8, wherein local LDD region is formed by injecting an impurity ion having a conductive type opposite to that of the source and drain regions.

12. The method of claim 8, wherein the local LDD region is formed by injecting an impurity ion having conductive type same as that of the source and drain regions.

* * * * *